United States Patent
Wamura et al.

(10) Patent No.: US 10,472,719 B2
(45) Date of Patent: Nov. 12, 2019

(54) NOZZLE AND SUBSTRATE PROCESSING APPARATUS USING SAME

(71) Applicant: Tokyo Electron Limited, Tokyo (JP)

(72) Inventors: Yu Wamura, Iwate (JP); Fumiaki Hayase, Iwate (JP); Masahiko Kaminishi, Iwate (JP); Kosuke Takahashi, Iwate (JP); Hiroko Sasaki, Iwate (JP); Yu Sasaki, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 529 days.

(21) Appl. No.: 14/933,123

(22) Filed: Nov. 5, 2015

(65) Prior Publication Data
US 2016/0138158 A1    May 19, 2016

(30) Foreign Application Priority Data
Nov. 19, 2014  (JP) ................. 2014-234500

(51) Int. Cl.
C23C 16/455     (2006.01)
H01J 37/32      (2006.01)
B05B 1/20       (2006.01)

(52) U.S. Cl.
CPC .. *C23C 16/45591* (2013.01); *C23C 16/45551* (2013.01); *C23C 16/45578* (2013.01); *H01J 37/3244* (2013.01); *B05B 1/205* (2013.01); *C23C 16/45587* (2013.01)

(58) Field of Classification Search
CPC .............. C23C 16/45578; C23C 16/45591
See application file for complete search history.

(56) References Cited

U.S. PATENT DOCUMENTS

| | | | |
|---|---|---|---|
| 2008/0035055 A1* | 2/2008 | Dip ............... | C23C 16/45578 118/715 |
| 2008/0106202 A1* | 5/2008 | Du ................ | H01J 37/32009 313/618 |
| 2010/0055347 A1* | 3/2010 | Kato .............. | C23C 16/45578 118/715 |

FOREIGN PATENT DOCUMENTS

| | | |
|---|---|---|
| JP | S61-037969 | 2/1986 |
| JP | S62-207797 | 9/1987 |
| JP | 2004-363142 | 12/2004 |
| JP | 2006-324400 | 11/2006 |
| JP | 2006324400 A * | 11/2006 |
| JP | 2010-056477 | 3/2010 |
| JP | 2010-114392 | 5/2010 |
| JP | 2010-135510 | 6/2010 |
| JP | 2012-084598 | 4/2012 |
| KR | 10-2006-0074774 | 7/2006 |
| KR | 10-2010-0027062 | 3/2010 |

(Continued)

*Primary Examiner* — Binu Thomas
(74) *Attorney, Agent, or Firm* — IPUSA, PLLC (57) ABSTRACT

A nozzle for supplying a fluid includes a tubular part including a tubular passage thereinside and a fluid discharge surface having a plurality of fluid discharge holes formed therein along a lengthwise direction of the tubular passage. A partition plate is provided in the tubular passage and extends along the lengthwise direction so as to partition the tubular passage into a first area including the fluid discharge surface and a second area without the fluid discharge surface. The partition plate has distribution holes whose number is less than a number of the plurality of fluid discharge holes in the lengthwise direction. A fluid introduction passage is in communication with the second area.

19 Claims, 8 Drawing Sheets

(56) References Cited

FOREIGN PATENT DOCUMENTS

KR   10-2013-0092508   8/2013

\* cited by examiner

NOZZLE AND SUBSTRATE PROCESSING APPARATUS USING SAME

CROSS-REFERENCE TO RELATED APPLICATION

The present application is based upon and claims the benefit of priority of Japanese Patent Application No. 2014-234500, filed on Nov. 19, 2014, the entire contents of which are incorporated herein by reference.

BACKGROUND OF THE INVENTION

1. Field of the Invention

The present invention relates to a nozzle and a substrate processing apparatus using the same.

2. Description of the Related Art

Conventionally, the following process is known as a film deposition method in a semiconductor manufacturing process. In the process, one or more atomic layers or molecular layers are formed on a surface of a substrate such as a semiconductor wafer (which is hereinafter referred to as just a "wafer") by causing a first reaction gas to adsorb on the surface of the wafer and then by switching a supplying gas from the first reaction gas to a second reaction gas to react with the first reaction gas on the surface of the wafer in a vacuum atmosphere. Then, a film is deposited on the substrate by repeating the above process many times so as to deposit the atomic layers or the molecular layers. This process is referred to as, for example, ALD (Atomic Layer Deposition) or MLD (Molecular Layer Deposition), which is an effective method that can respond to a demand of manufacturing a thinner film because the method can precisely control a film thickness depending on the number of cycles and achieve preferable uniformity of film quality across the surface of the wafer.

A film deposition of a gate oxide used in a gate of a MOS (Metal Oxide Semiconductor) transistor is cited as an example of preferable usage of such a film deposition method. For example, when depositing a silicon oxide film ($SiO_2$ film), bis(tertiary-butyl-amino)silane (which is hereinafter referred to as "BTBAS") gas or the like is used as the first reaction gas (source gas), and ozone ($O_3$) gas or the like is used as the second reaction gas (oxidation gas).

For example, Japanese Laid-Open Patent Application Publication No. 2010-56477 discloses a film deposition apparatus to implement the ALD or MLD. The disclosed film deposition apparatus implements the film deposition method by placing a plurality of substrates on a circular turntable in a circumferential direction provided in a process chamber, in which multiple process areas that supply different reaction gases from reaction gas nozzles provided in a side wall of the process chamber are provided separately from each other in the circumferential direction, and by supplying the different reaction gases in the process areas while rotating the turntable.

In the meantime, as the substrates have been increasing in size in recent years, for example, when the substrates are wafers, film depositions are performed on substrates having a diameter of 300 mm. Hence, according to the configuration of the gas nozzle provided in the side wall of the process chamber as discussed above, the length of the gas nozzles becomes long because the gas nozzles need to extend from the side wall to the vicinity of the center of the turntable in order to supply the reaction gases to the entire surfaces of the wafers placed on the turntable. Accordingly, when base portions of the gas nozzles are fixed to the side wall of the process chamber, the moment of tip portions of the gas nozzles become great, which causes the tip portions to be likely to descend due to its own weight.

When the gas nozzles are long, discharge rates of the gases from the gas nozzles become greater at the base portions that are closer to gas supply sources than at the tip portions of the gas nozzles. This causes a problem of making density of the reaction gases lower in the central area than in the peripheral area. To solve the problem, Japanese Laid-Open Patent Application Publication No. 2010-135510 discloses a film deposition apparatus configured to be able to adjust a distance between a surface of a wafer and a gas nozzle in a lengthwise direction of the gas nozzle by adjusting an inclination of the gas nozzle to the horizontal axis.

In the meantime, high-k processes for depositing high dielectric films are often used in recent years. Gas species for film deposition used in the high-k processes have caused a problem of deteriorating film properties because the gas species have such poor resistance properties as source gases that the gas species cannot sustain the same condition in a high temperature in the process chamber as the condition in a low temperature, and further because self-decomposition of the gas species occurs in a gas phase before adsorbing on a wafer. More specifically, in cases where the gas nozzle is provided in the side wall of the process chamber and extends toward the center of the turntable, when a source gas is supplied from the side wall, the self-decomposition of the source gas occurs before the source gas reaches the tip portion of the gas nozzle due to the high temperature in the process chamber, and a sufficient film deposition is not performed at and around the center of the turntable, which causes a problem of deteriorating uniformity of film thickness across the surface of the wafer.

Such a problem cannot be solved by just adjusting the inclination of the gas nozzle as disclosed in Japanese Laid-Open Patent Application Publication No. 2010-135510, and using a nozzle structured to prevent the self-decomposition of a source gas is needed.

SUMMARY OF THE INVENTION

Accordingly, embodiments of the present invention may provide a nozzle and a substrate processing apparatus that can prevent self-decomposition of a source gas and supply the source gas in a favorable condition.

According to an embodiment of the present invention, there is provided a nozzle for supplying a fluid that includes a tubular part including a tubular passage thereinside and a fluid discharge surface having a plurality of fluid discharge holes formed therein along a lengthwise direction of the tubular passage. A partition plate is provided in the tubular passage and extends along the lengthwise direction so as to partition the tubular passage into a first area including the fluid discharge surface and a second area without the fluid discharge surface. The partition plate has distribution holes whose number is less than a number of the plurality of fluid discharge holes in the lengthwise direction. A fluid introduction passage is in communication with the second area.

According to another embodiment of the present invention, there is provided a substrate processing apparatus that includes a process chamber and a susceptor provided in the process chamber and configured to hold a substrate on a surface thereof. A nozzle including a fluid discharge surface is provided so that the fluid discharge surface faces the surface of the susceptor. The nozzle includes a tubular part including a tubular passage thereinside and a fluid discharge surface having a plurality of fluid discharge holes formed therein along a lengthwise direction of the tubular passage. A partition plate is provided in the tubular passage and extends along the lengthwise direction so as to partition the tubular passage into a first area including the fluid discharge surface and a second area without the fluid discharge surface. The partition plate has distribution holes whose number is less than a number of the plurality of fluid discharge holes in the lengthwise direction. A fluid introduction passage is in communication with the second area.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF THE PREFERRED EMBODIMENTS

A description is given below of embodiments of the present invention with reference to accompanying drawings.

Figure 1:
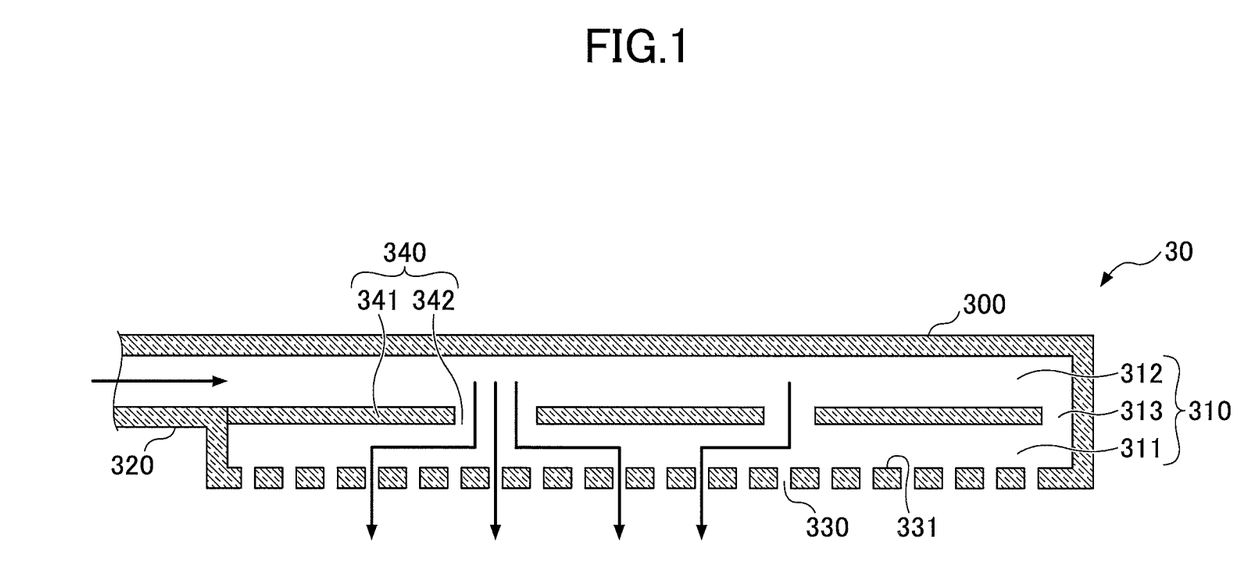
FIG. 1 is a cross-sectional view illustrating an example of a configuration of a nozzle according to an embodiment of the present invention.

FIG. 1 is a cross-sectional view illustrating a configuration of an example of a nozzle according to an embodiment of the present invention. A nozzle 30 of the embodiment of the present invention includes a tubular part 300, a tubular passage 310, a fluid introduction passage 320, fluid discharge holes 330, and a partition plate 340. The tubular part 300 includes the tubular passage 310 thereinside, and the fluid discharge hole 330 is formed in a lower surface of the tubular passage 310. The partition plate 340 is provided between an upper surface and the lower surface inside the tubular passage 310. The partition plate 340 partitions the tubular passage 310 into a fluid discharge area 311 including a fluid discharge surface 311 in which the fluid discharge holes 330 are formed, and a fluid flow area 312 without a surface in which the fluid discharge holes 330 is formed. Moreover, the tubular passage 310 includes a folded passage 313 that communicates the fluid discharge area 311 with the fluid flow area 312 in the vicinity of the tip. The partition plate 340 includes a partition part 341 formed into a plate-like shape, and distribution holes 342 are formed in predetermined locations of the partition part 341. A base portion of the tubular part 300 is connected to the fluid introduction passage 320. Because the nozzle 30 is often used as a unit to inject a fluid such as a gas into a process chamber when used in a substrate processing apparatus, the nozzle 30 may be referred to as an injector.

The tubular part 300 is a tube-shaped portion including the tubular passage 310 that allows a fluid to flow through the inside thereof. A cross section of the tubular part 300 may be formed into a variety of shapes depending on the intended purpose. For example, the cross section of the tubular part 300 may be formed into a quadrangle, preferably a rectangle. Although the nozzle 30 of the present embodiment can be used for a variety of intended purposes for supplying a fluid, for example, the nozzle 30 may be used in a substrate processing apparatus that processes a wafer and the like. When the nozzle 30 of the embodiment is used in the substrate processing apparatus and the nozzle 30 having the multiple fluid discharge holes 330 in a width direction as well as in a lengthwise direction of the tubular part 300 is provided horizontally facing a surface of a wafer, all distances from the multiple fluid discharge holes 330 to the surface of the wafer are preferred to be made equal. Accordingly, the tubular part 300 may be formed into a quadrangle such as a rectangle so as to cause the distance between a lower surface of the tubular part 300 facing the wafer and the surface of the wafer to be constant in the entire area of the lower surface of the tubular part 300, in other words, so as to make the lower surface of the tubular part 300 parallel to the surface of the wafer. However, forming the tubular part 300 into a circular tube shape or a cylindrical shape is naturally possible, and the tubular part 300 can be formed into a variety of shapes depending on the intended purpose.

The plurality of fluid discharge holes 330 is provided in the lower surface of the tubular part 300. The fluid discharge holes 330 penetrate through the lower surface of the tubular part 300 so as to be in communication with the outside, and function as holes for discharging and supplying a fluid flowing through the tubular passage 310 to an area facing the fluid discharge holes 330. The fluid discharge holes 330 may be formed into through holes vertically penetrating the wall surface of the tubular part 300. The number of the fluid discharge holes 330 may be set at a variety of proper numbers depending on the intended purpose. For example, when supplying a source gas for film deposition to the surface of the wafer, hundreds of the fluid discharge holes 330, for example, about seven hundred of the fluid discharge holes 330, are provided. Although the fluid discharge holes 330 may be formed into a variety of shapes depending on the intended purpose, for example, the fluid discharge holes 330 may be formed to have a circular cross-sectional shape.

Although the fluid discharge holes 330 may be arranged variously, for example, the fluid discharge holes 330 may be arranged at predetermined intervals in the lengthwise direction. The fluid discharge holes 330 may be arranged at regular intervals in the lengthwise direction of the nozzle 30 in order to ensure uniform supply of the fluid in the lengthwise direction. Furthermore, the plurality of fluid discharge holes 330 may be formed in the width direction of the nozzle 30, and multiple lines of the fluid discharge holes 330 arranged in the lengthwise direction are formed in the width direction so as to form multiple rows. Details on this point are described later.

The partition plate 340 is provided in the intermediate position between the upper surface and the lower surface of the tubular passage 310 so as to partition the inner space and the inner surface of the tubular passage 310 by being bonded to the inner surface of the tubular part 30 forming the tubular passage 310. More specifically, the partition plate 340 partitions and separates the inner space and the inner surface of the tubular passage 310 into the fluid discharge area 311 on the fluid discharge hole side including the fluid discharge holes 330 and the fluid flow area 312 opposite to the fluid discharge holes 330 without the fluid discharge holes 330. In addition, the partition plate 340 is not formed at the tip of the tubular passage 310, thereby forming the folded passage 313 to cause the fluid discharge area 311 to be in communication with the fluid flow area 312.

The partition plate 340 includes the plate-like partition part 341 and the distribution holes 342 formed in the partition part 341. Only the number of distribution holes 342 less than the number of fluid discharge holes 330 is formed in the lengthwise direction of the tubular part 300 and the tubular passage 310. More specifically, the distribution holes 342 have a diameter larger than that of the fluid discharge holes 330, and are formed to be arranged at intervals greater than the intervals between the adjacent fluid discharge holes 330 in the lengthwise direction of the tubular part 300 and the tubular passage 310. Hence, the number of the distribution holes 342 is consequently less than the number of the fluid discharge holes 330.

The partition plate 340 is provided to prevent a fluid such as a source gas from not being able to reach the tip portion due to the self-decomposition of the source gas in the middle of the tubular passage 310 when the fluid such as the source gas is introduced from the fluid introduction passage 320. More specifically, when a film deposition process and the like are performed on a wafer in the process chamber by using the conventional nozzle without the partition plate 340, a phenomenon of the self-decomposition of the source gas sometimes occurs before the source gas reaches the tip of the nozzle due to the relationship among the high temperature, the pressure in the process chamber and the flow rate and the like of the supplied source gas, and the source gas is not sufficiently supplied to the tip of the nozzle, thereby decreasing the uniformity of film thickness across the surface of the film deposited on the wafer. In order to prevent such a phenomenon, the nozzle 30 of the embodiment includes the partition plate 340 in the tubular passage 310, thereby preventing the self-decomposition of the source gas. More specifically, by providing the partition plate 340, the source gas introduced from the fluid introduction passage 320 enters the fluid flow area 312, and a part of the source gas goes along the fluid flow area 312, reaches the fluid discharge area 311 by way of the folded passage 313, reaches the fluid discharge holes 330 from the tip portion to the base portion in sequence, and is discharged therefrom. In other words, the tubular passage 310 including a folded structure can be formed by providing the partition plate 340, and thus a flow supplying the source gas from the tip portion of the fluid discharge holes 330 toward the base portion of the fluid discharge holes 330 can be formed. In contrast, a part of the source gas introduced from the fluid introduction passage 320 and having reached the fluid flow area 312 reaches the fluid discharge area 311 from the distribution holes 342 in the middle of going through the fluid flow area 312 from the base portion toward the tip portion of the nozzle 30, and is discharged therefrom.

When supplying the source gas from the nozzle 30, although the inside of the process chamber is generally set at a high temperature, because the fluid discharge holes 330 are formed in the lower surface of the tubular part 300 of the nozzle 30, and because the fluid discharge holes 330 are covered with the partition plate 340, the heat transferred into the tubular passage 310 of the nozzle 30 through the fluid discharge holes 330 are blocked by the partition plate 340, thereby preventing the source gas in the fluid flow area 342 from being directly heated by the heat. Accordingly, the source gas in the fluid flow area 342 can reach the tip portion of the tubular passage 310 without the self-decomposition, and a flow of the source gas sequentially discharged from the fluid discharge holes 330 of the tip portion of the tubular passage 310 can be formed. As discussed above, because the source gas reaching the fluid discharge area 311 from the distribution holes 342 is also present, two flows of the supply of the source gas from the fluid discharge holes 330 of the base portion of the nozzle 30 and the supply of the source gas from the fluid discharge holes 330 of the tip portion can be formed simultaneously, and thus the supply of the source gas can be made uniform in the lengthwise direction of the nozzle 30.

Moreover, by various changing the dimension and the arrangement of the distribution holes 340 of the partition plate 340 depending on the intended purpose, the distribution of the discharge rate of the source gas between the tip side and the base side of the nozzle 30, the pressure and its distribution in the tubular passage 310, the temperature and its distribution in the tubular passage 310 and the like can be variously adjusted. For example, the distance between the distribution holes 342 may be increased with the increasing distance from the base of the nozzle.

The partition plate 340 is preferred not to have the distribution hole 342 in a junction of the fluid introduction passage 320 and the partition plate 340, and the partition part 341 is preferably configured to be continuously connected to the inner surface of the fluid introduction passage 320. This is because the adjustment of the supply balance of the source gas in the lengthwise direction of the nozzle 30 becomes easier by temporarily holding the source gas introduced from the fluid introduction passage 320 and then supplying the source gas to the base portion of the nozzle 30 by way of the adjustable distribution holes 342, since the supplied amount of the source gas is basically likely to be more at the base portion than at the tip portion.

Although the partition plate 340 may be arranged in a variety of forms, the partition plate 340 is preferably arranged so as to be parallel to the fluid discharge surface 331 when the fluid discharge surface 331 in which the fluid discharge holes 330 are formed has a flat surface. On the other hand, when the fluid discharge surface 331 has a curved surface, the partition plate 340 is preferably symmetrically arranged with respect to the fluid discharge holes 330. This allows the fluid discharge area 311 and the fluid flow area 312 to be symmetrically arranged with respect to the fluid discharge holes 330, which makes it possible to uniformly supply the source gas.

Here, although the above example has been described by citing an example of applying the nozzle 30 of the embodiment to the source gas supply nozzle of the film deposition apparatus, the nozzle 30 of the present embodiment can be applied to the fluid including a liquid as well as the gas.

The partition plate 340 may be referred to as a baffle plate or a baffle because the partition plate 340 is a plate for blocking the flow of the fluid and adjusting the flow of the fluid.

The fluid introduction passage 320 is a flow passage for introducing a fluid to the tubular passage 310 in the nozzle 30 from a fluid supply source, and is connected to the fluid flow area 312 of the tubular passage 310. Hence, the fluid introduction passage 320 preferably has the same cross section as that of the fluid flow area 312, but the fluid introduction passage 320 may be configured in a variety of forms as long as the fluid introduction passage 320 is in communication with the fluid flow area 312.

The tubular part 300 including the fluid discharge holes 330 and the fluid introduction passage 320 are preferred to be configured in an integrated fashion. Although the partition plate 340 can be formed as a separate component from the tubular part 300 and can be bonded to or attached to the inside of the tubular passage 310 so as to be fixed thereto, the tubular part 330 and the fluid introduction passage 320 is preferred to be configured in a unified manner from the beginning so as not to generate a gap and the like between the partition plate 340 and the inner surface of the fluid introduction passage 320. Although a material for these components can be selected from a variety of materials depending on the intended purpose, for example, quartz can be selected therefrom. Because quartz is often used in the nozzle of the substrate processing apparatus such as the film deposition apparatus, the entire nozzle 30 may be formed of quartz in an integrated fashion when the nozzle 30 is used for the substrate processing apparatus.

Figure 2:
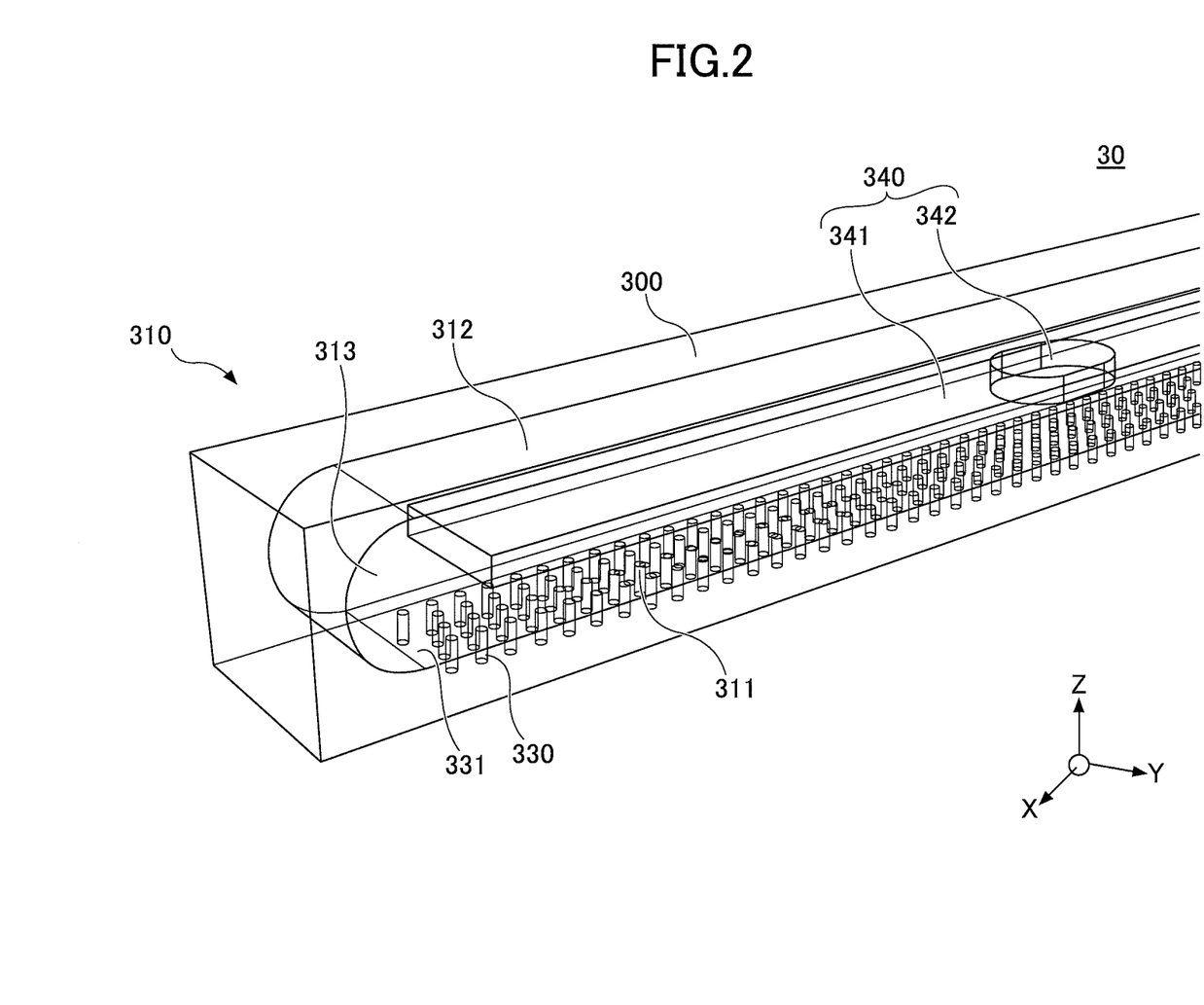
FIG. 2 is a transparent perspective view illustrating an example of a configuration of the nozzle according to the embodiment of the present invention.

FIG. 2 is a transparent perspective view illustrating an example of a configuration of the nozzle 30 of an embodiment of the present invention. Although the nozzle 30 illustrated in FIG. 2 has components similar to those of the nozzle 30 described in FIG. 1, FIG. 2 depicts parts of the nozzle 30 simplified in FIG. 1 in more detail. Here, FIG. 2 illustrates the tip portion of the nozzle 30.

As illustrated in FIG. 2, the fluid discharge holes 330 may be provided in the width direction as well as the lengthwise direction of the nozzle 30. This causes the plurality of lines of the fluid discharge holes 330 arranged along the lengthwise direction of the nozzle 30 to be arranged in the width direction, which makes it possible to uniformly discharge and supply a fluid even in the width direction of the nozzle 30. Moreover, as illustrated in FIG. 2, the fluid discharge holes 330 adjacent to each other in the width direction of the nozzle 30 may be arranged at different positions in the lengthwise direction (orthogonal projection projected in the lengthwise direction). FIG. 2 illustrates an example of four lines of the fluid discharge holes 330 arranged at predetermined intervals in the lengthwise direction. In FIG. 2, the arrangement of the fluid discharge holes 330 in each of the lines are shifted from each other in the lengthwise direction, and many orthogonally-disposed rows composed of four of the fluid discharge holes 330 are formed in the width direction and are orthogonally arranged in parallel to each other. In this manner, the lines of the fluid discharge holes 330 arranged at predetermined intervals along the lengthwise direction may be arranged at different positions in the lengthwise direction so as to be shifted from each other in the lengthwise direction in order to uniformly cover the whole area both in the lengthwise direction and in the width direction. This enables the fluid to be supplied uniformly.

Here, as illustrated in FIG. 2, the fluid discharge holes 330 are formed into small columnar holes so as to penetrate through the lower surface of the tubular part 310 with high density so as to uniformly cover the lower surface of the tubular part 310. Although the number of the fluid discharge holes 330 may change variously depending on the intended purpose, as illustrated in FIG. 2, the fluid discharge holes 330 are preferred to be formed with the high density enough to uniformly cover the fluid discharge surface 331. For example, when the nozzle 30 is configured to have a length of about 50 cm, about seven hundreds of the fluid discharge holes 330 may be formed.

As illustrated in FIG. 2, the partition plate 340 may be provided to have a plate-like shape such that the end thereof is connected to the side surface of the inner surface of the tubular passage 310, and to extend along the lengthwise direction of the nozzle 30. The partition plate 340 extends in the lengthwise direction so as to partition the tubular passage 310 into the fluid discharge area 311 and the fluid flow area 312 along the lengthwise direction, and causes the fluid discharge area 311 to be in communication with the fluid flow area 312 through the distribution holes 342 provided in midstream. The distribution holes 342 have a diameter much larger than that of the fluid discharge holes 330, and large enough to include the plurality of fluid discharge holes 330. The distribution holes 342 have the same width as that of the partition part 341, and only a single distribution hole 342 is formed in the width direction, which differs from the fluid discharge holes 330 in that the plurality of fluid discharge holes 330 can be formed in the width direction. However, the plurality of distribution holes 342 can be formed in the width direction depending on the intended purpose.

In addition, the distance between the adjacent distribution holes 342 is much larger than that of the fluid discharge holes 330. The distribution holes 342 equal to or less than ten are formed in the partition plate 340 when the nozzle 30 has the length of 50 cm as discussed above. For example, about seven distribution holes 342 may be formed in the partition plate 340. Here, in FIG. 2, although the distribution holes 342 are formed to have a shape similar to an ellipse as a whole like combining a rectangle extending along the lengthwise direction of the nozzle 30 and a circle, the distribution holes 342 may be formed into a variety of shapes depending on the intended purpose.

The folded passage 313 is formed in the tip of the tubular passage 310, and the tip of the tubular passage 310 may have a curved inner surface by processing the inner surface of the tubular passage 310 so as to form the curved inner surface. This allows the fluid to smoothly return from the tip by flowing through the folded passage 313.

Thus, the nozzle 30 of the embodiment can be configured to have a variety of shapes as long as the nozzle 30 includes the partition plate 340 having the distribution holes 342.

Figure 3:
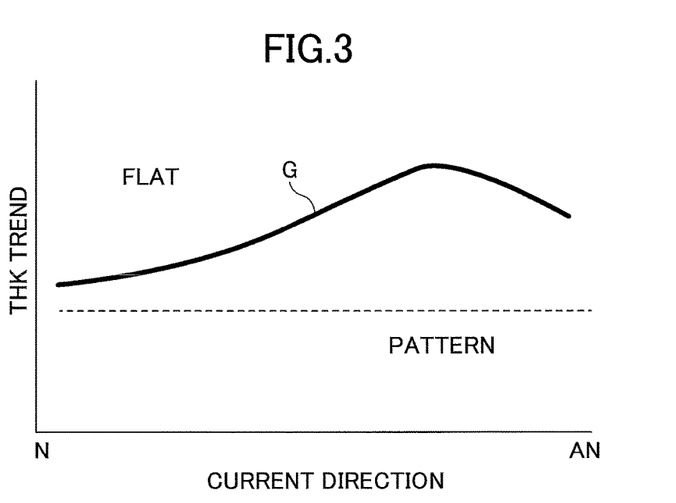
FIG. 3 is a graph illustrating an example of discharge distribution of a source gas required for a source gas nozzle of a film deposition apparatus.

FIG. 3 is a graph illustrating an example of discharge distribution of a source gas required for a source gas nozzle of a film deposition apparatus. In FIG. 3, a letter "N" in the transverse axis indicates a base portion of a nozzle and letters "AN" indicate a tip portion of the nozzle. The longitudinal axis indicates distribution of a source gas discharge rate and film thickness distribution of a deposited film. When depositing a film on a wafer having an interconnection pattern such as a trench and a via-hole formed in a surface of the wafer, a characteristic curve G expressed by a solid line in FIG. 3 is known as a preferable distribution characteristic curve. More specifically, when the characteristic curve G has a peak at a point slightly closer to the tip portion than the center; the source gas discharge rate approximately symmetrically decreases with respect to the peak; and the flow rate distribution curve becomes convex upward so that the source gas discharge flow rate is the lowest at the base portion of the nozzle, uniformity of the film thickness becomes the most preferable as expressed by a dashed line.

Accordingly, when the characteristic curve G expressed by the solid line in FIG. 3 is reproduced by measuring the discharge flow rate of the nozzle, the nozzle that can achieve the preferable film thickness uniformity, can be implemented.

Figure 4:
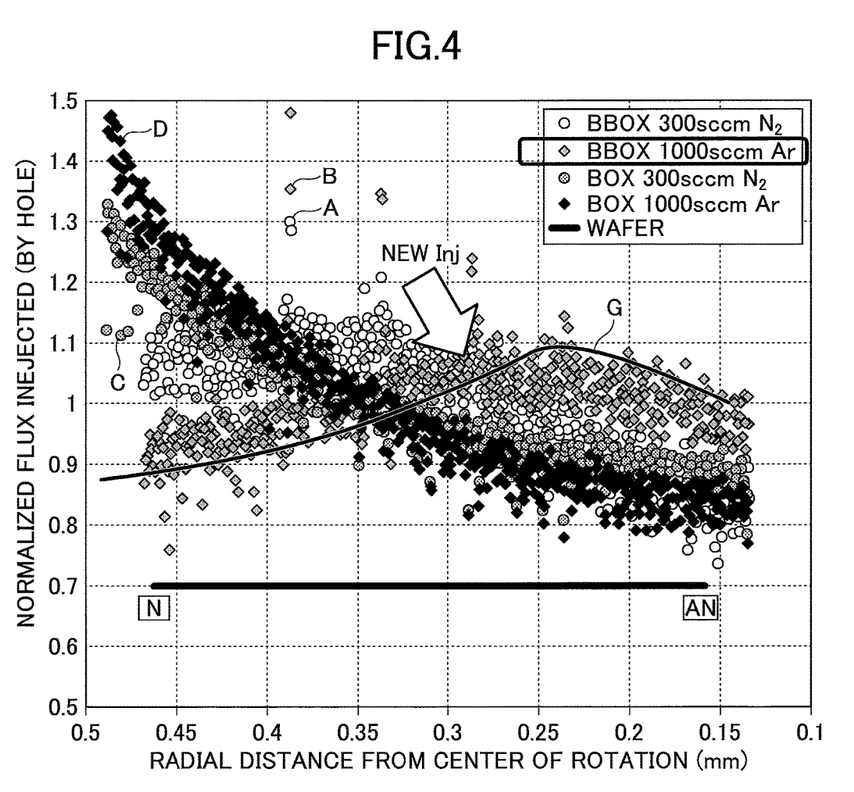
FIG. 4 is a graph showing a simulation result simulating a nozzle according to an embodiment of the present invention.

FIG. 4 is a graph showing a simulation result when simulating the nozzle 30 of the embodiment of the present invention. In FIG. 4, dots "A" show discharge flow rate distribution when supplying $N_2$ gas at a flow rate of 300 sccm by using the nozzle 30 of the embodiment, and dots "B" show discharge flow rate distribution when supplying Ar gas at a flow rate of 1000 sccm by using the nozzle 30 of the embodiment. Moreover, as a comparative example, dots "C" show discharge flow rate distribution when supplying $N_2$ gas at a flow rate of 300 sccm by using a conventional nozzle without the partition plate 340, and dots "D" show discharge flow rate distribution when supplying Ar gas at a flow rate of 1000 sccm by using the conventional nozzle without the partition plate 340.

As illustrated in FIG. 4, the dots A and the dots B using the nozzle 30 of the embodiment have the distribution similar to the characteristic curve G in FIG. 3. In contrast, the dots C and the dots D have the distribution having high values on the left side and low values on the right side, which is greatly different from the characteristic curve G.

Accordingly, this simulation result indicates that the nozzle 30 of the embodiment is a nozzle that can implement the film deposition having the excellent film thickness uniformity across the surface of a wafer. Thus, according to the nozzle 30 of the embodiment, by providing the partition plate 340 having the adjustable distribution holes 342 in the tubular passage 310 inside the tubular part 300, the discharge flow rate distribution of a fluid can be set at desired distribution, and the fluid can be discharged and supplied at the discharge flow rate distribution appropriate for a variety of substrate processes.

Next, a description is given below of a substrate processing apparatus according to an embodiment to which the nozzle 30 of the embodiment of the present invention is applied, with reference to FIGS. 5 through 9. Here, the substrate processing apparatus according to the embodiment of the present invention is described by citing an example of a turntable type (described later) substrate processing apparatus using a susceptor that is configured to be a film deposition apparatus performing the film deposition on surfaces of a plurality of substrates by supplying a fluid to a predetermined supply area. However, the susceptor does not have to be the turntable type, and the substrate process does not have to be the film deposition. The substrate processing apparatus of the embodiment can be applied to a variety of substrate processing apparatuses using a nozzle.

Figure 5:
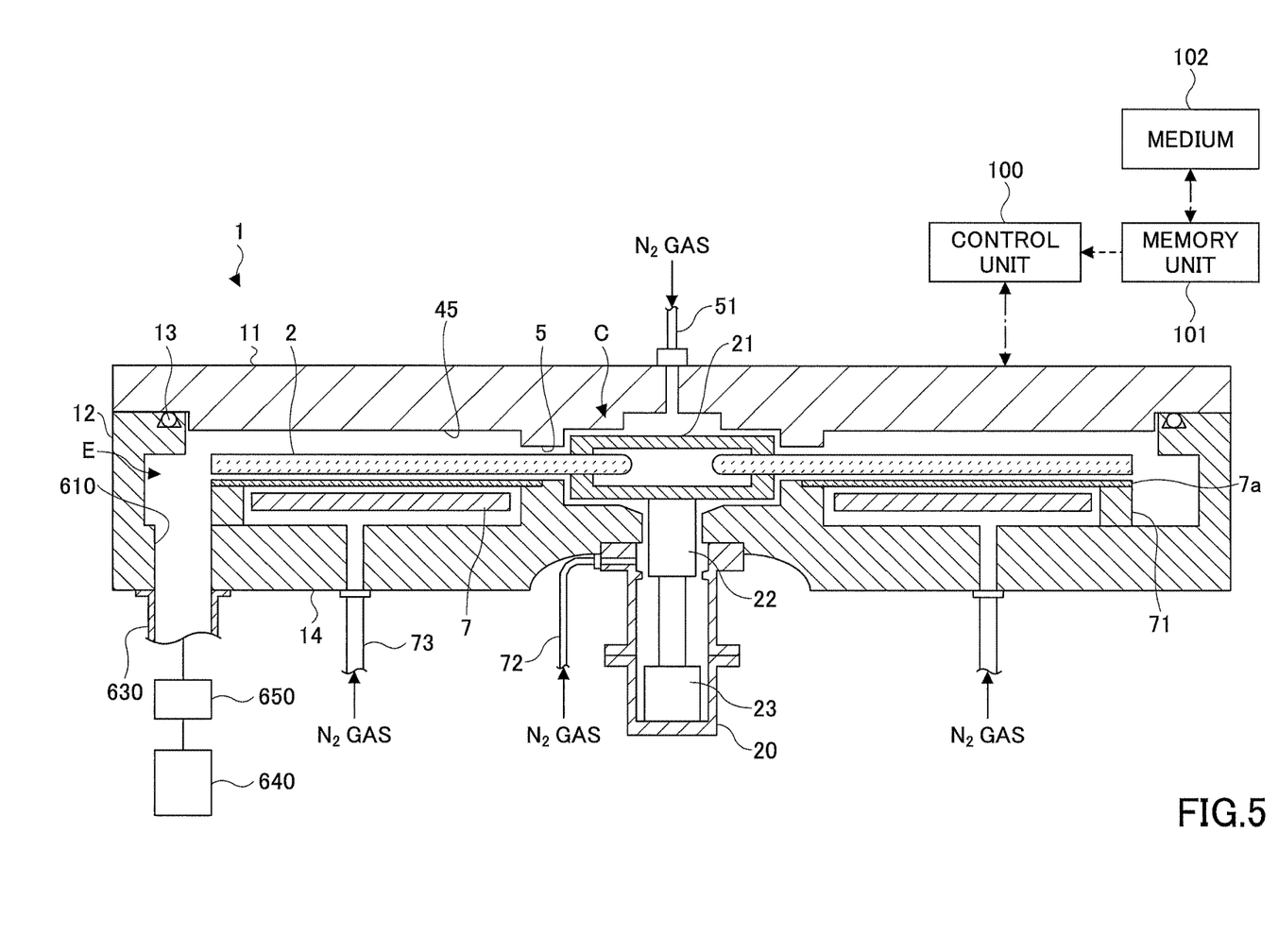
FIG. 5 is a cross-sectional view illustrating an example of a substrate processing apparatus according to a first embodiment of the present invention.
Figure 6:
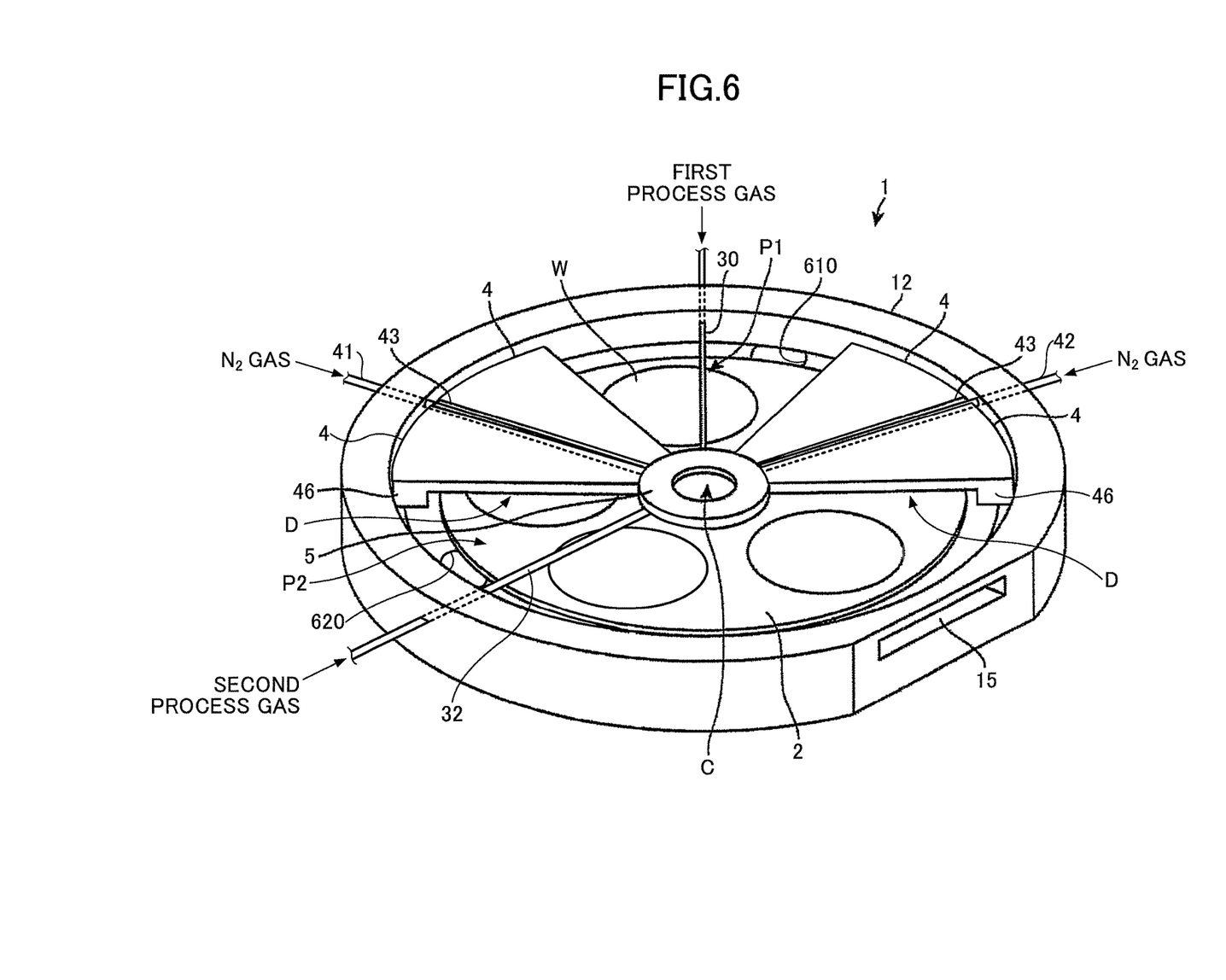
FIG. 6 is a perspective view illustrating a structure inside a vacuum chamber of the substrate processing apparatus in FIG. 5.
Figure 7:
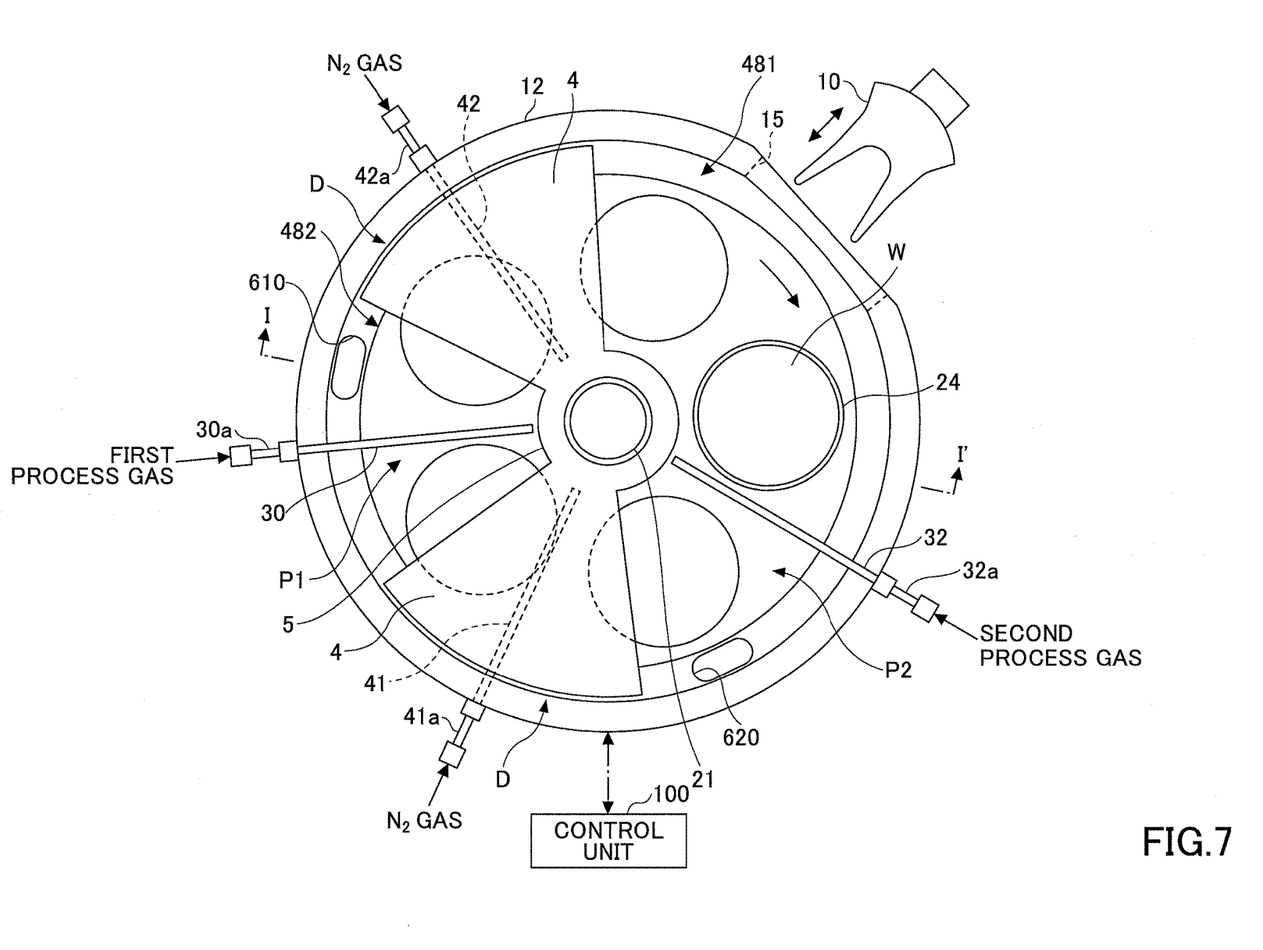
FIG. 7 is a schematic top view illustrating a structure inside the vacuum chamber of the substrate processing apparatus in FIG. 5.

Here, FIG. 5 is a cross-sectional view of the substrate processing apparatus taken along line I-I' of FIG. 7. FIGS. 6 and 7 are diagrams used to describe an exemplary internal structure of a process chamber 1 (described later) of the substrate processing apparatus. In FIGS. 6 and 7, a top plate 11 (described later) is omitted for convenience of explanation.

Figure 8:
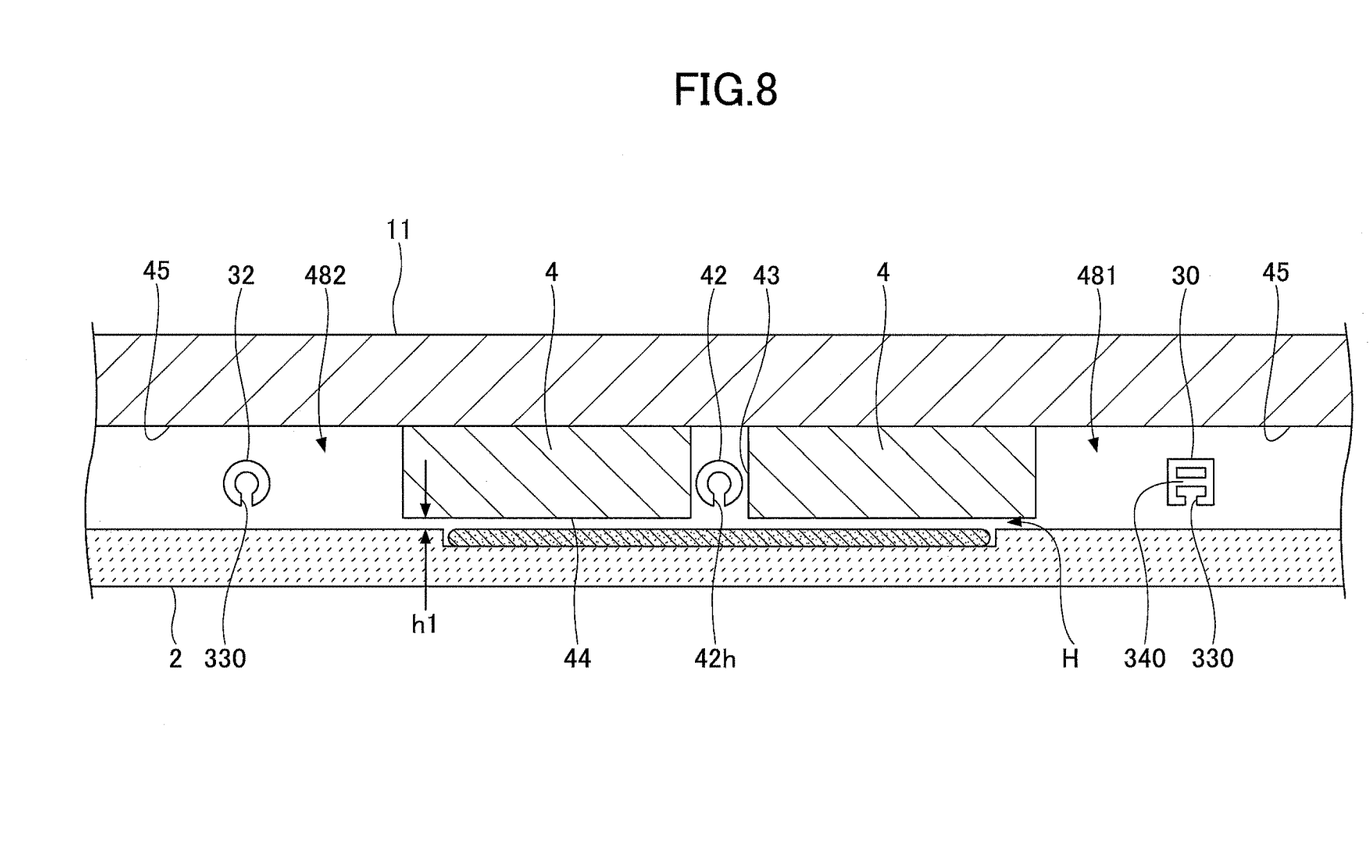
FIG. 8 is a partial cross-sectional view of the substrate processing apparatus in FIG. 5.
Figure 9:
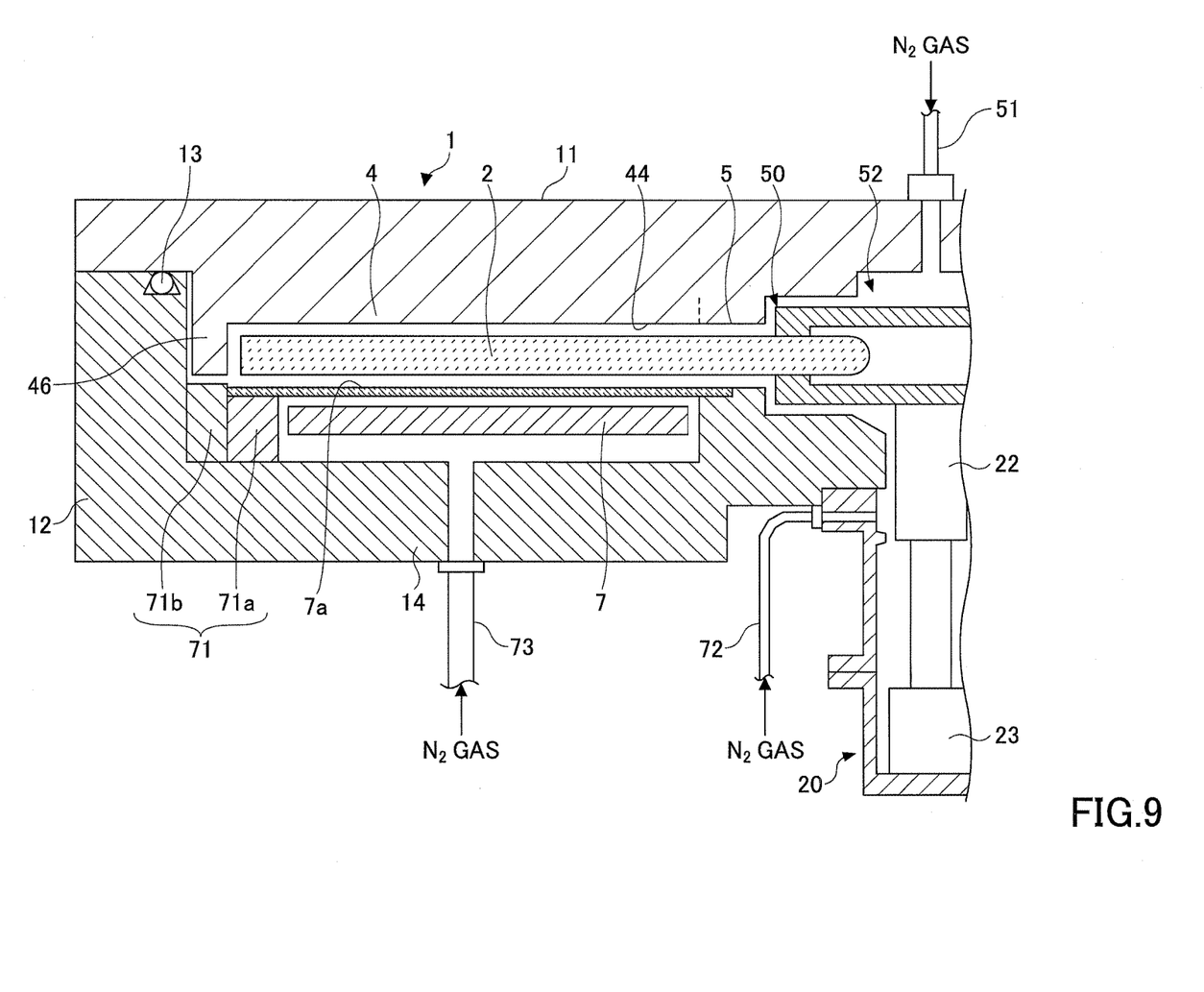
FIG. 9 is another partial cross-sectional view of the substrate processing apparatus in FIG. 5.

FIG. 8 is a cross-sectional view of apart of the process chamber 1 from a process gas nozzle 30 (described later) to a process gas nozzle 32 taken along a concentric circle of a susceptor 2 (described later). FIG. 9 is a partial cross-sectional view illustrating an area where a ceiling surface 44 (described later) is provided. The process gas nozzle 30 has a configuration similar to the nozzle 30 of the embodiment of the present invention, and is the nozzle 30 including the partition plate 340 having the distribution holes 342 inside the tubular passage 310.

As illustrated in FIGS. 5 through 7, the substrate processing apparatus according to the embodiment of the present invention includes the process chamber 1 having a substantially circular shape in a plan view and a flat shape in a side view, the susceptor 2 disposed in the process chamber 1, and a control unit (controller) 100 for controlling operations of the entire substrate processing apparatus (e.g., the control unit 100 controls a timing of supplying gases from process gas nozzles 30 and 32).

The process chamber 1 includes a chamber body 12 formed into a closed-end cylinder and a top plate 11 that is placed on the chamber body 12 and detachable from the chamber body 12. The top plate 11 is attached to the chamber body 12 via a sealing member 13 (see FIG. 5) such as an O-ring and hermetically seals the process chamber 1.

The susceptor 2 is fixed to a cylindrical core part 21 housed in a case body 20 such that the center of the process chamber 1 coincides with the center of rotation of the susceptor 2. The susceptor 2 has holding areas in its upper surface to receive a plurality of substrates (which are hereafter referred to as "wafers W").

The case body 20 is a cylindrical case having an opening at its upper end. A flange at the upper end of the case body 20 is hermetically attached to a lower surface of a bottom part 14 of the process chamber 1. The case body 20 isolates the internal atmosphere of the process chamber 1 from the external atmosphere.

The core part 21 is fixed to an upper end of a rotational shaft 22 that extends in the vertical direction. The rotational shaft 22 penetrates through the bottom part 14 of the process chamber 1. A lower end of the rotational shaft 22 is attached to a drive unit 23 that rotates the rotational shaft 22 about a vertical axis. The rotational shaft 22 and the drive unit 23 are housed in the case body 20.

As illustrated in FIG. 7, multiple (five in the present embodiment) recesses 24 for holding the wafers W (substrate holding areas) are formed in the upper surface of the susceptor 2. The recesses 24 have a substantially circular shape and are arranged along the rotational direction (or the circumferential direction) of the susceptor 2. In FIG. 7, for convenience sake, only one wafer W placed in one of the recesses 24 is illustrated. The number of wafers W that the susceptor 2 can hold is not limited to five. The susceptor 2 that can be used in the embodiment of the present invention may instead be configured to hold four or less wafers W or six or more wafers W.

In the present embodiment, each of the recesses 24 has an inside diameter (e.g., 4 mm greater than the diameter of the wafer W) that is slightly greater than the diameter (e.g., 300 mm) of the wafer W. The depth of each of the recesses 24 is substantially the same as the thickness of the wafer W. This causes the height of the upper surfaces of the wafers W placed in the recesses 24 to become substantially the same as the height of the upper surface (where the wafers W are not placed) of the susceptor 2.

In the substrate processing apparatus of the present embodiment, the process gas nozzle 30 is a first gas supply part and is disposed in a first process area (described later) above the susceptor 2. As discussed above, the process gas nozzle 30 is the nozzle of the embodiment described above, and is used as the process gas nozzle 30 for supplying a source gas in the substrate processing apparatus of the present embodiment. The process gas nozzle 32 is a second gas supply part and is disposed in a second process area (described later) that is apart from the first process area in the circumferential direction of the susceptor 2. Separation gas nozzles 41 and 42 are separation gas supply parts and are disposed between the first process area and the second process area. For example, the nozzles 30, 32, 41, and 42 may be made of quartz.

More specifically, as illustrated in FIGS. 6 and 7, the process gas nozzle 32, the separation gas nozzle 41, the process gas nozzle 30, and the separation gas nozzle 42 are arranged clockwise (along the rotational direction of the susceptor 2) in this order from a transfer opening 15 for transferring the wafers W. In other words, the process gas nozzle 32, the separation gas nozzle 41, the process gas nozzle 30, and the separation gas nozzle 42 are arranged at intervals along the circumferential direction of the process chamber 1. Gas introduction ports 30a, 32a, 41a and 42a, which are outer ends of the gas nozzles 30, 32, 41 and 42, are fixed to the outer peripheral wall of the chamber body 12. The gas nozzles 30, 32, 41 and 42 are inserted through the outer peripheral wall of the chamber body 12 into the process chamber 1. In the process chamber 1, the gas nozzles 30, 32, 41 and 42 extend parallel to the upper surface of the susceptor 2 in the radial direction of the chamber body 12 toward the center of rotation of the susceptor 2.

Multiple gas discharge holes (see FIG. 8) facing the susceptor 2 are formed in the lower surface of each of the process gas nozzles 30 and 32. For example, the gas discharge holes may be arranged at 10-mm intervals in the lengthwise direction of the corresponding process gas nozzle 30 or 32. An area below the process gas nozzle 30 functions as an area for causing a first process gas to adsorb on a wafer W (which is hereinafter referred to as a "first process area P1"). An area below the process gas nozzle 32 functions as an area for causing a second gas to react with the first process gas adsorbed on the wafer W so as to deposit a reaction product of the first process gas and the second process gas (which is hereinafter referred to as a "second process area P2"). Here, for example, a source gas such as an organometallic gas used for depositing a high dielectric film (high-k film) may be used as the first process gas, and for example, tris(dimethylamino)cyclopentadienylzirconium ($C_{11}H_{23}N_3Zr$) and the like are available for the first process gas. A reaction gas such as an oxidation gas (e.g., $O_2$ gas or $O_3$ gas), a nitriding gas (e.g., $NH_3$ gas) or the like may be used as the second process gas. In general, the self-decomposition often occurs in supplying a source gas composed of a organometallic gas when depositing a high dielectric film, using the process gas nozzle 30 of the embodiment when depositing the high-k film is highly effective. However, the first process gas is not limited to the above-mentioned gas, and a variety of gases can be used.

The process gas nozzle 32 is disposed in the second process area P2 that is zoned above the upper surface of the susceptor 2. The process gas nozzle 32 is connected to a gas supply source (not shown) for supplying the second process gas via a pipe and the like (not shown). Thus, the process gas nozzle 32 supplies the second process gas to the upper surface of the susceptor 2. In the present embodiment, the process gas nozzle 32 supplies the second process gas into the process chamber 1 (the second process area P2) by complementarily opening and closing valves (not shown).

Each of the separation gas nozzles 41 and 42 is disposed between the first process area P1 and the second process area P2 that are provided apart from each other in the circumferential direction of the susceptor 2. Each of the separation gas nozzles 41 and 42 is connected to a gas supply source (not shown) for supplying a separation gas via a pipe and the like (not shown). Thus, the separation gas nozzles 41 and 42 supply the separation gas to the upper surface of the susceptor 2.

The substrate processing apparatus of the present embodiment can use a variety of reaction gases reactable with the first process gas as the second process gas, but may use, for example, an oxygen-containing gas as the second process gas. The oxygen-containing gas is, for example, oxygen gas or ozone gas. The first process gas supplied from the process gas nozzle 30 and adsorbed on the substrate is oxidized by the second process gas supplied from the process gas nozzle 32, thereby generating an oxidation product.

In the present embodiment, the substrate processing apparatus uses an inert gas as the separation gas. Examples of the inert gas include a noble gas such as argon (Ar) gas and helium gas, and nitrogen gas. The separation gas is used as a purge gas for purging the wafer W. In the present embodiment, a description is given below of an example of using $N_2$ gas, which is generally used as the purge gas, as the separation gas.

As illustrated in FIGS. 6 and 7, two convex portions 4 are provided in the process chamber 1 of the substrate processing apparatus. In a plan view, each convex portion 4 has an approximately sectorial shape whose top part is cut off to form an arc (inner arc). In the present embodiment, the inner arc of the convex portion 4 is connected to a protruding portion 5. The convex portion 4 is disposed such that its outer arc (which is at an end of the convex portion 4 opposite to the inner arc) becomes substantially parallel to the inner circumferential surface of the chamber body 12 of the process chamber 1.

More specifically, as illustrated in FIG. 8, the convex portions 4 are attached to the lower surface of the top plate 11. The convex portion 4 includes a flat lower surface that is referred to as a ceiling surface 44 (first ceiling surface). Parts of the lower surface of the top plate 11 on both sides of the ceiling surface 44 in the circumferential direction are referred to as ceiling surfaces 45 (second ceiling surfaces). The ceiling surfaces 45 are higher than the ceiling surface 44. Thus, the convex portion 4 forms a narrow separation space(s) H and spaces 481 and 482, into which gas flows from the separation space H, in the process chamber 1. In other words, the convex portions 4 form narrow separation spaces H that function as separation areas D illustrated in FIG. 6.

Also, as illustrated in FIG. 8, a groove 43 is formed in the middle in the circumferential direction of the convex portion 4. The groove 43 extends in the radial direction of the susceptor 2. The separation gas nozzle 42 is placed in the groove 43 of one of the convex portions 4, and the separation gas nozzle 41 is placed in the groove 43 of the other one of the convex portions 4.

Here, gas discharge holes 42h are formed in a lower surface of the separation gas nozzle 42, which faces the susceptor 2. The gas discharge holes 42h are arranged at predetermined intervals (e.g., 10-mm intervals) in the lengthwise direction of the separation gas nozzle 42. The opening diameter of each of the gas discharge holes 42h is, for example, from about 0.3 mm to about 1.0 mm. Although not illustrated in the drawings, gas discharge holes are also formed in the separation gas nozzle 41 in a similar manner.

Furthermore, as illustrated in FIG. 8, the process gas nozzles 30 and 32 are disposed in spaces below the higher ceiling surfaces 45. The process gas nozzles 30 and 32 are positioned apart from the ceiling surfaces 45 and close to the wafer W or the upper surface of the susceptor 2. Here, as illustrated in FIG. 8, the process gas nozzle 30 is disposed in the space 481 (space below the higher ceiling surface 45), and the process gas nozzle 32 is disposed in the space 482 (space below the higher ceiling surface 45).

The narrow separation space H is formed between the lower ceiling surface 44 and the upper surface of the susceptor 2. When an inert gas (e.g., $N_2$ gas) is supplied from the separation gas nozzle 42, the inert gas flows into the spaces 481 and 482 through the separation space H. Because the volume of the separation space H is smaller than the volumes of the spaces 481 and 482, the pressure in the separation space H where the inert gas is supplied becomes higher than the pressures in the spaces 481 and 482. Thus, the separation space H provides a pressure barrier between the spaces 481 and 482.

Furthermore, the flow of the inert gas from the separation space H into the spaces 481 and 482 functions as a counter flow to the first process gas in the first process area P1 and the second process gas in the second process area P2. Accordingly, the substrate processing apparatus of the present embodiment is configured to separate the first process gas in the first process area P1 from the second process gas in the second process area P2 by using the separation space H. In other words, the substrate processing apparatus is configured to prevent the first process gas from mixing and reacting with the second process gas in the process chamber 1.

A height h1 of the ceiling surface 44 from the upper surface of the susceptor 2 can be determined based on the pressure in the process chamber 1 during a film deposition process, the rotational speed of the susceptor 2, and/or the amount of the supplied separation gas ($N_2$ gas) so that the pressure in the separation space H becomes higher than the pressures in the spaces 481 and 482. The height h1 of the ceiling surface 44 from the upper surface of the susceptor 2 can be also determined based on the specifications of the substrate processing apparatus and types of supplied gases. Furthermore, the height h1 of the ceiling surface 44 from the upper surface of the susceptor 2 can be determined in advance by experiments or calculations.

As illustrated in FIGS. 6 and 7, the protruding portion 5 is provided on the lower surface of the top plate 11 to surround the core part 21 to which the susceptor 2 is fixed. The protruding portion 5 is connected to the center-side ends (inner arcs) of the convex portions 4. The lower surface of the protruding portion 5 is formed to have the same height as the ceiling surface 44.

As illustrated in FIG. 6, an L-shaped bent portion 46 is formed at the outer end of the convex portion 4 (i.e., an end that is closer to the inner circumferential surface of the vacuum chamber 1). The bent portion 46 faces the outer end surface of the susceptor 2. The bent portion 46 prevents gases from flowing between the space 481 and the space 482 through a gap between the susceptor 2 and the inner circumferential surface of the chamber body 12. The sectorial convex portion 4 is provided on the lower surface of the top plate 11.

A small gap is provided between the outer surface of the bent portion 46 and the chamber body 12 so that the top plate 11 can be detached from the chamber body 12. For example, the gap between the inner surface of the bent portion 46 and the outer end surface of the susceptor 2 and the gap between the outer surface of the bent portion 46 and the chamber body 12 can be set at a value that is substantially the same as the height of the ceiling surface 44 from the upper surface of the susceptor 2.

Referring to FIG. 7 again, a first evacuation port 610 in communication with the space 481 (FIG. 8) and a second evacuation port 620 in communication with the space 482 (FIG. 8) are formed between the susceptor 2 and the inner circumferential surface of the chamber body 12. As illustrated in FIG. 5, each of the first evacuation port 610 and the second evacuation port 620 is connected to an evacuation unit (e.g., a vacuum pump 640) via an evacuation pipe 630. Here, a pressure controller 650 may be provided in the evacuation pipe 630 between each of the first and second evacuation ports 610 and 620 and the vacuum pump 640.

As illustrated in FIGS. 5 and 9, a heater unit 7 is provided in a space between the susceptor 2 and the bottom part 14 of the vacuum chamber 1. The heater unit 7 heats, via the susceptor 2, the wafers W on the susceptor 2 to a temperature (e.g., 450° C.) specified by a process recipe. A ring-shaped cover member 71 is provided below the outer periphery of the susceptor 2. The cover member 71 prevents entry of gases into a space below the susceptor 2.

As illustrated in FIG. 9, the cover member 71 includes an inner member 71a and an outer member 71b. The inner member 71a is provided below the susceptor 2 and spans an area that corresponds to the outer periphery of the susceptor 2 and a narrow space surrounding the outer circumference of the susceptor 2. The outer member 71b is provided between the inner member 71a and the inner circumferential surface of the vacuum chamber 1. The outer member 71b is disposed below the bent portion 46 formed at the outer end of the convex portion 4 such that a small gap is formed between the outer member 71b and the lower end of the bent portion 46. The inner member 71a surrounds the heater unit 7.

The control unit 100 illustrated in FIG. 5 sends commands (or signals) to other components of the substrate processing apparatus, thereby controlling operations of the components. The control unit 100 may be constituted of a computer or an arithmetic processing unit for controlling operations of the entire substrate processing apparatus. For example, the control unit 100 executes a program stored in a memory unit 101 to control hardware components of the substrate processing apparatus, thereby depositing a film on the surfaces of the plurality of wafers W. The control unit 100 may include a central processing unit (CPU) and a memory (e.g., ROM or RAM).

More specifically, the memory of the control unit 100 may store a program for causing the substrate processing apparatus (or the CPU) to perform a substrate process described later. The program may include code units corresponding to steps to be performed in the substrate process. The control unit 100 reads the program from a storage medium 102 (e.g., a hard disk, a compact disk, a magneto-optical disk, a memory card, or a flexible disk), stores the program in the memory unit 101, and then installs or loads the program into the control unit 100.

Next, a description is given below of a procedure to perform a film deposition process by using the substrate processing apparatus described above.

To begin with, a wafer W is placed on each of the plurality of recesses 24 provided in the upper surface of the susceptor 2. More specifically, a gate valve (not illustrated in the drawings) is opened, and the wafer W is transferred into the recess 24 of the susceptor 2 through the transfer opening 15 by using the transfer arm 10 (see FIG. 7). When the recess 24 stops at a position facing the transfer opening 15, the wafer W may be transferred into the recess 24 by moving lift pins (not illustrated in the drawings) up and down from the bottom side of the process chamber 1 via through holes formed in the bottom of the recess 24. Moreover, the wafer W is placed on each of the plurality of (five, in the present embodiment) recesses 24 of the susceptor 2 by intermittently rotating the susceptor 2.

Next, after the inside of the process chamber 1 is set at a predetermined pressure, a separation gas is supplied into the process chamber 1. More specifically, after closing the gate valve and evacuating the process chamber 1 to the lowest ultimate vacuum by using the vacuum pump 640, the separation gas (e.g., N₂ gas) is supplied into the process chamber 1 from the separation gas nozzles 41 and 42 at a predetermined flow rate. At this time, the separation gas is also supplied from the separation gas supply pipe 51 and the purge gas supply pipes 72 and 73 (see FIGS. 5 and 9) at a predetermined flow rate. Furthermore, the pressure inside the process chamber 1 can be adjusted to a preliminarily set process pressure by using the pressure controller 650. Next, the wafers W are heated by using the heater unit 7 while rotating the susceptor 2, for example, in a clockwise fashion.

Subsequently, the first process gas nozzle 30 and the second process gas nozzle 32 start supplying process gases. The wafers W are processed by starting the supply of a first process gas and a second process gas. A source gas is supplied from the first process gas nozzle 30 in the first process area P1 and adsorbs on surfaces of the wafers W, and a reaction gas reactable with the source gas adsorbed on the wafers W is supplied from the second process gas nozzle 32 in the second process area P2. Then, a reaction product of the source gas and the reaction gas deposits on the wafers W, and a molecular layer made of the reaction product deposits on the wafers W. Here, the wafers W periodically pass through the first process area P1, the separation area D, the second process area P2 and the separation area D by the rotation of the susceptor 2, and a film deposits on the wafers W for each rotation of the susceptor 2. Even when a source gas for depositing a high dielectric film is supplied from the first process gas nozzle 30, the source gas is not decomposed by the self-decomposition and is discharged and supplied at the discharge flow rate distribution described in FIGS. 3 and 4. A high dielectric film is deposited with a high degree of film thickness uniformity across the surface of the wafer W. When the deposited film reaches a predetermined film thickness, the first process gas nozzle 30 stops supplying the source gas that is the first process gas, and the second process gas nozzle 32 continues to supply the oxidation gas or the nitriding gas as necessary, thereby treating the 4 film. Here, the treatment is not performed if unnecessary, and the supply of the first process gas and the second process gas may stop at the same time.

After finishing the supply of the process gases from the first process gas nozzle 30 and the second process gas nozzle 32, the wafers W are carried out of the process chamber 1 by a reverse procedure to the carry-in procedure. More specifically, the gate valve (not illustrated in the drawings) is opened, and the wafers W on which the film is deposited are carried out of the process chamber 1 through the transfer opening 15 by using the transfer arm 10 (see FIG. 7). The wafers W are carried out by using the lift pins (not illustrated in the drawings).

As discussed above, the film deposition process is performed. Because the source gas is supplied at the desired flow rate distribution without being decomposed by the self-decomposition, the film deposition can be performed while keeping the high uniformity of film thickness across the surface of the wafer, thereby depositing a high-quality film.

Moreover, the substrate processing apparatus may be a substrate processing apparatus that performs not only the film deposition process but also a variety of substrate processes, and the nozzle of the embodiment can be applied not only to the gas but also a fluid such as a liquid or the like. In this case, because an ideal discharge flow rate distribution differs depending on a type of a process, a nozzle structure relating to the partition plate 340 and the distribution holes 342, and process conditions such as a temperature and a pressure in the process chamber may be properly adjusted so as to have the proper flow rate distribution for each process. Because the nozzle 30 of the embodiment can adjust a dimension, the arrangement and the like of the distribution holes 342 of the partition plate 340 in a variety of forms, the nozzle 30 can adjust to the variety of conditions flexibly and properly. In addition, although the description has been given by citing an example of the nozzle 30 being used as the source gas nozzle, because a type of a gas is not limited, applying the nozzle 30 to the reaction gas such as the oxidation gas and the nitriding gas is also possible.

According to the embodiments of the present invention, a source gas can be supplied in a preferable condition.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A nozzle for supplying a fluid, comprising:
a tubular part including a tubular passage thereinside and a fluid discharge surface having a plurality of fluid discharge holes formed therein along a lengthwise direction of the tubular passage;
a partition plate provided in the tubular passage and extending along the lengthwise direction so as to vertically partition the tubular passage into a first area including the fluid discharge surface and a second area without the fluid discharge surface, the second area lying immediately above the first area via the partition plate, the partition plate having distribution holes'whose number is less than a number of the plurality of fluid discharge holes in the lengthwise direction, the distribution holes and the plurality of fluid discharge holes facing each other; and
a fluid introduction passage in communication with the second area,
wherein a tip of the tubular part is closed,
wherein the partition plate is not formed at the tip of the tubular passage, and
wherein a folded passage to allow the fluid to flow from the second area to the first area by turning is formed at the tip of the tubular passage.

2. The nozzle as claimed in claim 1, wherein a first diameter of the distribution holes is larger than a second diameter of the fluid discharge holes.

3. The nozzle as claimed in claim 1, wherein the plurality of fluid discharge holes are formed at predetermined intervals in the lengthwise direction.

4. The nozzle as claimed in claim 1, wherein the plurality of fluid discharge holes forms a plurality of lines in a width direction of the tubular passage.

5. The nozzle as claimed in claim 4, wherein the plurality of fluid discharge holes forming each of the plurality of lines are formed at different positions in the lengthwise direction from the plurality of fluid discharge holes forming the other plurality of lines.

6. The nozzle as claimed in claim 3, wherein the distribution holes are formed at second intervals that are longer than the predetermined intervals in the lengthwise direction.

7. The nozzle as claimed in claim 6, wherein the second intervals are predetermined regular intervals.

8. The nozzle as claimed in claim 1, wherein the distribution holes is not formed in a junction of the fluid introduction passage and the partition plate.

9. The nozzle as claimed in claim 8, wherein the fluid introduction passage and the second area have the same cross section, and the second area is continuously connected to the fluid introduction passage.

10. The nozzle as claimed in claim 1, wherein an area of the folded passage in a same plane as the partition plate is larger than an area of each of the plurality of distribution holes.

11. The nozzle as claimed in claim 1, wherein the tubular part has a rectangular cross section.

12. The nozzle as claimed in claim 1, wherein the tubular part, the partition plate and the fluid introduction passage are made of quartz in an integrated fashion.

13. A substrate processing apparatus, comprising:
a process chamber;
a susceptor provided in the process chamber and configured to hold a substrate on a surface thereof; and
a nozzle including a fluid discharge surface provided so that the fluid discharge surface faces the surface of the susceptor,
wherein the nozzle includes
a tubular part including a tubular passage thereinside and a fluid discharge surface having a plurality of fluid discharge holes formed therein along a lengthwise direction of the tubular passage;
a partition plate provided in the tubular passage and extending along the lengthwise direction so as to vertically partition the tubular passage into a first area including the fluid discharge surface and a second area without the fluid discharge surface, the second area lying immediately above the first area via the partition plate, the partition plate having distribution holes whose number is less than a number of the plurality of fluid discharge holes in the lengthwise direction, the distribution holes and the plurality of fluid discharge holes facing each other; and
a fluid introduction passage in communication with the second area,
wherein a tip of the tubular part is closed,
wherein the partition plate is not formed at the tip of the tubular passage, and
wherein a folded passage to allow the fluid to flow from the second area to the first area by turning is formed at the tip of the tubular passage.

14. The substrate processing apparatus as claimed in claim 13,
wherein the susceptor is configured to be rotatable and to hold a plurality of substrates along a circumferential direction thereof, and
the nozzle is provided to extend along a radial direction of the susceptor and arranged so that the fluid introduction passage is disposed at a peripheral side and a tip of the tubular part is disposed at a central side of the susceptor.

15. The substrate processing apparatus as claimed in claim 14,
wherein the processing chamber includes a first process area configured to supply a source gas to the susceptor and a second process area configured to supply a process gas reactable with the source gas above the susceptor and apart from each other in the circumferential direction, and
the nozzle is provided in the first process area.

16. The substrate processing apparatus as claimed in claim 15, further comprising:
a separation gas supply area configured to supply a purge gas to the susceptor and provided in a space between the first process area and the second process area.

17. The substrate processing apparatus as claimed in claim 16, wherein the fluid introduction passage is connected to a gas supply source capable of supplying a gas for depositing a high dielectric film as the source gas.

18. The substrate processing apparatus as claimed in claim 17,
wherein the second process area includes a process gas supply nozzle to supply the process gas to the susceptor,
wherein the separation area includes a purge gas supply nozzle to supply the purge gas to the susceptor, and
wherein both of the process gas supply nozzle and the purge gas supply nozzle do not have the partition plate.

19. The substrate processing apparatus as claimed in claim 13, wherein an area of the folded passage in a same plane as the partition plate is larger than an area of each of the plurality of distribution holes.

* * * * *